United States Patent [19]

Kawabe et al.

[11] Patent Number: 4,825,115

[45] Date of Patent: Apr. 25, 1989

[54] ULTRASONIC TRANSDUCER AND METHOD FOR FABRICATING THEREOF

[75] Inventors: Kenji Kawabe, Yokohama; Kazuhiro Watanabe, Tokyo; Fumihiro Namiki, Machida; Atsuo Iida, Yokohama; Takaki Shimura, Machida, all of Japan

[73] Assignee: Fujitsu Limited, Kawasaki, Japan

[21] Appl. No.: 204,909

[22] Filed: Jun. 10, 1988

[30] Foreign Application Priority Data

Jun. 12, 1987 [JP] Japan ................................ 62-147292

[51] Int. Cl.$^4$ ................................ H01L 41/08

[52] U.S. Cl. ................................ 310/327; 310/336; 310/368; 29/25.35

[58] Field of Search ................................ 310/327, 336, 368; 29/25.35

[56] References Cited

U.S. PATENT DOCUMENTS

| | | | |
|---|---|---|---|
| 4,310,957 | 1/1982 | Sachs | 310/368 X |
| 4,611,141 | 9/1986 | Hamada et al. | 310/335 X |
| 4,616,152 | 10/1986 | Saito et al. | 310/327 X |
| 4,704,774 | 11/1987 | Fujii et al. | 29/25.35 |
| 4,747,192 | 5/1988 | Rokurota | 310/327 X |

FOREIGN PATENT DOCUMENTS

| | | | |
|---|---|---|---|
| 0148247 | 9/1982 | Japan | 29/25.35 |

*Primary Examiner*—Francis Jaworski
*Attorney, Agent, or Firm*—Staas & Halsey

[57] ABSTRACT

Ultrasonic transducer having a plurality of piezoelectric elements arranged in a matrix, and a method for fabricating them. L shaped printed wiring boards are respectively bonded to each arrays of piezoelectric elements arranged in azimuthal direction. The bonding points of the L shaped printed wiring board to respective piezoelectric element are located at edge portion of respective back electrode. The other branch of L shaped printed wiring boards are stretched vertically to the surface of the piezoelectric elements matrix. A backing plate is formed by molding on the back side of the piezoelectric elements matrix leaving the top of the L shaped printed wiring board protruded from the molded surface of the molded backing plate. Such configuration prevents the reflection from the wiring plate of the piezoelectric element. A flexible printed wiring board is provided with wiring pattern having bonding areas positioned corresponding to the matrix of piezoelectric elements. So, the bonding of the printed wiring board to each of the piezoelectric element is easy. After the bonding, the printed wiring board is cut and bent vertically to the matrix surface to form the L shape. The matrix of piezoelectric elements may be cut out from a large size piezoelectric element before the molding of the backing plate or after its molding.

13 Claims, 9 Drawing Sheets

ULTRASONIC TRANSDUCER AND METHOD FOR FABRICATING THEREOF

BACKGROUND OF THE INVENTION

The present invention relates to a structure of ultrasonic transducer used for ultrasonic diagnosis, more precisely, it relates to a wiring method to a plurality of piezoelectric elements mounted in the transducer head.

Ultrasonic tomography is widely used in diagnosis or failure detection in various materials. In such applications, the transducer head that radiates ultrasonic pulse waves and receives their echoes from various parts of the target is provided with a plurality of piezoelectric elements arranged in an array with a predetermined pitch. The transducer head which is provided with such arrays is called a linear array, phased array or convex array etc., according to the way of arrangement of the piezoelectric elements and the scanning methods of the output wave.

The electronic pulses to energize each of these piezoelectric elements are controlled to shift their phase between each other so as to radiate the ultrasonic wave in a beam directed to a specific direction or focus the beams to a desired point. By controlling the phase of the electronic pulses applied to respective piezoelectric elements, the direction of the output ultrasonic wave beam or its focus can be varied. But these controls can be done only in a plane coplanar with the array. This plane is called the azimuthal plane. The beam scanning is done in the azimuthal direction. In the direction orthogonal to the azimuthal plane the beam can not be scanned, this direction being called the direction of elevation in the art. In the elevation direction, the beam has a fixed expanse determined by the length of each piezoelectric element and the wave length of the output ultrasonic wave.

In order to obtain higher resolution in the azimuthal direction, that is azimuthal resolution of the ultrasonic tomogram, it is necessary to reduce the pitch of the piezoelectric elements in the array, and reduce the size of elements. In a transducer head of recent ultrasonic tomography, 128 piezoelectric elements each 0.55 mm wide and 15 mm long are arranged with a pitch of 0.6 mm, for example. But in order to attain higher resolution or to vary the focal length in the elevation direction, it is necessary to divide the piezoelectric elements in the direction of their length (in the direction of elevation) and arrange the arrays in parallel to each other, so the piezoelectric elements are arranged in a matrix. But there occurs a difficulty of wiring to each of the piezoelectric elements. So, in the state-of-the-art devices only three arrays of the piezoelectric elements are arranged in the elevation direction. But the more fine pitch and the more columns of array in the elevation direction are desirable.

In order to make more apparent the difficulty of the wiring in the ultrasonic transducer head, and to make clear the merits of the present invention, the problem of the wiring to each of the piezoelectric elements will be described. FIG. 1 shows an exemplary transducer head used for ultrasonic diagnosis. In the following explanation, a transducer head for ultrasonic tomography which is used for diagnosis will be referred to as an example, but the explanation can be extended over other applications such as failure detector, or ultrasonic reflectometer etc.

The transducer head shown in FIG. 1, radiates an ultrasonic pulse wave from an acoustic window 21 which passes through freely the ultrasonic wave. The transducer head 20 is contacted with its window 21 to a specimen which is to be tested or to be diagnosed. And the ultrasonic wave is radiated through the acoustic window 21 to the specimen, human body for example (not shown). The reflected waves from various parts of the specimen, such as human organs for example, are detected by the same head 20, converted into electric signals, and transferred to a processor (not shown) by a multi-cored cable 22. In the processor, the detected signals are treated like a manner of radar technology, and provide a tomographic image of the object in the human body.

A unit of the piezoelectric transducer has a structure as shown in FIG. 2(*a*). A piezoelectric element 1 is sandwiched by electrodes 2A and 2B. By applying electric potential between these electrodes, the piezoelectric element 1 is energized and shrinks or stretches to generate an ultrasonic wave. Contrary, if an echo of the ultrasonic wave reaches the element, an electric potential appears between the electrodes 2A and 2B. In a transducer head, a plurality of such piezoelectric units are arranged in an array, and such arrays are further aligned in parallel to each other to form a matrix as shown in FIG. 2(*b*). In the figure, three arrays of piezoelectric elements are arranged in a matrix of three columns.

As shown in FIG. 2(*b*), on the lower surface of the piezoelectric element 1 is provided a front matching layer 10, for matching the acoustic impedance of the piezoelectric element 1 to that of the material which includes the targets in order to transmit the sound energy effectively into the material, human body for example. The words "front" or "back" will be used hereinafter to designate the direction or position referring to the direction toward which the ultrasonic wave is radiated from the piezoelectric element or to its opposite direction respectively. The front matching layer 10 usually has a thickness approximately equal to $\frac{1}{4}$ wave length of the ultrasonic wave propagating in the matching layer 10. The front electrodes 2B of these elements are electrically connected to each other and grounded. This connection is usually done by using a conductive material for the front matching layer 10. In front of the front matching layer 10 is provided an acoustic lens (not shown) to focus the ultrasonic wave in the direction of elevation. This acoustic lens is sealed to the case 23 of the transducer head 20, and composes the acoustic window 21.

The matrix of the piezoelectric elements is formed by cutting a large size piezoelectric element in both azimuth and elevation directions by first slits 12 and second slits 13 which are orthogonal to each other. The back electrodes 2A must be connected to respective lead wires. As shown in FIG. 2(*b*), the piezoelectric elements in arrays on both sides of the matrix can be connected directly to a printed wiring board 11, which has a plurality of contact areas arranged in a position to meet respective piezoelectric elements, and wirings to them are provided on the printed wiring board 11. But it is impossible to attach a printed board directly to the array in the middle column of the matrix. The reason is as follows. On the back side (upper side in the figure) of the piezoelectric elements are provided a backing plate 15 as shown in FIG. 2(*c*). The backing plate 15 is made of material which absorbs the ultrasonic wave to eliminate a reflection from the back side of the piezoelectric element 1. If there is not provided the backing plate 15, a multi reflection occurs and noise appears in the received signal, which reduces the sensitivity and resolution of the transducer head. Accordingly, if the printed wiring board is connected to the middle column in parallel to the other printed boards 11, it must cross over the other arrays positioned on both sides of the middle column. This causes the reflection. It is sufficient to connect the printed wiring board vertically to the surface of the piezoelectric elements. The difficulty may be easily understood by thinking of the small size of the piezoelectric elements, 0.56 mm wide or less for example.

Therefore in prior art transducer, as shown in FIG. 2, fine bonding wires 14 are bonded to each of the elements in the middle column. Then, the backing plate 15 is formed by molding. After that, another ends of each bonding wires 14 are bonded to respective terminals 17 formed on a terminal plate 16 which is attached on one side of the backing plate 15. In such prior art structure, however, the chance increases to short circuit the bonding wires 14 to each other when the pitch of the array is decreased, especially the short circuits are apt to occur during the molding process of the backing plate 15. The difficulty in bonding the wires to each back electrode 2A rapidly increases as the size and pitch of the unit piezoelectric element is reduced. Further it is difficult to keep each bonding wire 14 in the backing plate 15 straight and vertical to the plane of the matrix without suffering from disconnection. If the bonding wire is bent in the backing plate 15, it causes the reflection.

By the reasons described above, it was difficult to decrease the pitch of the elements and increase the number of the columns in the matrix of the piezoelectric elements, though the requirement has been increased.

BRIEF DESCRIPTION OF THE INVENTION

The object of the present invention, therefore, is to provide a method to connect a printed wiring board directly to each column of the matrix formed by piezoelectric elements in an ultrasonic transducer head.

Another object of the present invention is to decrease the pitch of the piezoelectric elements arranged in a matrix in an ultrasonic transducer to increase the resolution of the detectors using the ultrasonic transducer.

Still another object of the present invention is to increase the number of columns in a matrix formed by piezoelectric elements in an ultrasonic transducer head, and to control the acoustic beam not only in the azimuthal direction but also in the direction of elevation.

Further object of the invention is to make easy the wiring to each piezoelectric element in an ultrasonic transducer, and to increase the production yield and reliability of the transducer.

The ultimate object of the present invention is to provide an ultrasonic transducer head having a high resolution and ability to control the ultrasonic beam radiated from it, not only in the azimuthal direction but also in the elevation direction.

According to the present invention, a flexible printed wiring board is directly bonded to the back electrodes of the piezoelectric elements. The contact areas formed on the printed wiring board are arranged to meet respective back electrodes of piezoelectric elements arranged in a matrix. This makes easy the bonding to inner column and fine pitched piezoelectric elements. Then the printed wiring board is cut along each edge of the elements along the azimuthal direction, and bent vertically to the surface of the matrix. This is one feature of the present invention.

Next, the backing plate is formed by molding. The back electrode and the bonded end of the printed wiring boards are buried into the backing plate. But the other ends of the wiring boards protrude from the molded surface of the backing plate.

Another feature of the present invention is to bond the terminal pads of the printed wiring board to one edge portion of the respective back electrode. This reduces the acoustic reflection at the bonding point to the minimum.

Still another feature of the present invention is in the cutting method to form the matrix of the piezoelectric elements out from a large piezoelectric element. Two cutting methods are proposed.

One is to cut a large piezoelectric element which is stuck to the front matching layer, before the printed wiring board is bonded to its back electrode. The cutting is done from the back side of the device to form the matrix. Then the printed wiring board is aligned on the matrix, bonded, cut and bent vertically. After that the backing plate is molded.

Another way is to cut the large piezoelectric element after the backing element is molded. Namely, the wiring board is bonded on the back electrode of a large piezoelectric element. The bonding areas on the wiring board are arranged at each position corresponding to the matrix. So, the bonding points are aligned on the large piezoelectric element in a matrix form. After the bonding, the wiring board is cut along the azimuthal direction, bent vertically, and the backing plate is molded. Then the large piezoelectric element is cut into the matrix from its front side.

By such cutting methods, the difficulties in bonding to the fine pitched matrix of the piezoelectric elements are traversed. The details and variation of above procedures, together with the advantages of the present invention will become apparent in the following description of the preferred embodiments.

BRIEF DESCRIPTION OF THE DRAWINGS

FIG. 2 illustrates schematically the structure and bonding method of prior art ultrasonic transducer, wherein:

FIG. 2(*a*) illustrates the structure of piezoelectric element;

FIG. 2(*b*) illustrates how each of the elements are wired by prior art method; and FIG. 2(*c*) shows a partial perspective view of a device shown in FIG. 2(*b*) after the backing plate is molded.

FIG. 3 illustrates schematically a first method for bonding a printed wiring board to a piezoelectric matrix elements by the present invention, wherein:

FIG. 3(*a*) shows a matrix of piezoelectric elements which are cut out from a large size element;

FIG. 3(*b*) shows a state when the printed wiring board is bonded to the piezoelectric elements;

FIG. 3(*c*) shows a side view of the device which is shown in FIG. 3(*b*);

FIG. 3 (*d*) illustrates a state when the printed wiring board is cut and bent vertically to the surface of the matrix; and FIG. 3(*e*) shows a partial perspective view of the transducer when the backing plate is molded, and the ultrasonic lens is fixed.

FIG. 4 illustrates the wiring pattern and construction of the wiring board used in an embodiment of FIG. 3, wherein:

FIG. 4(*a*) is a plan view of the wiring pattern formed on the flexible printed circuit board; and FIG. 4(*b*) is a schematic cross section of the wiring board illustrating its structure.

FIG. 5 illustrates a modification of the first method, which is applicable when the column of the piezoelectric elements are few, wherein:

FIG. 5(*a*) shows a state, when a printed circuit board having a rectangular opening is aligned and bonded to the matrix of piezoelectric elements;

FIG. 5(*b*) shows a side view of the state of FIG. 5(*a*);

FIG. 5(*c*) is a side view of a state when the printed circuit board is cut and bent vertically to the matrix surface; and FIG. 5(*d*) is a partial perspective view of a state, when the backing plate is molded.

FIG. 7 illustrates schematically a second method for cutting a large size piezoelectric element into a matrix by the present invention, wherein:

FIG. 7(*a*) shows a state when the printed wiring board is bonded to the large size piezoelectric element;

FIG. 7(*b*) shows a state, when the printed wiring board is cut and bent vertically to the the piezoelectric element;

FIG. 7(*c*) shows a state when the backing plate is molded;

FIG. 7(*d*) is a partial perspective view showing the reverse side of the head illustrating a state when the large size piezoelectric element is cut along the azimuthal direction;

FIG. 7(*e*) is an enlarged partially cutaway view of FIG. (*d*) illustrating the relation between the cutting slits and the printed wiring board; and FIG. 7(*f*) illustrates a state when the front matching layer is attached to the piezoelectric elements.

Throughout the drawings, same or like reference numerals designate same or corresponding parts.

DESCRIPTION OF THE PREFERRED EMBODIMENTS

The method of how to wire to each piezoelectric element in the ultrasonic transducer head by the present invention will be explained with respect to a preferred embodiments. The following disclosure will be given referring to an embodiment of transducer head used for ultrasonic tomography. The disclosed size, dimension, number of columns, materials, and so on are all specific ones relevant to the embodiment. The invention is by all means not restricted to them, therefore, they may be properly modified within the scope of the invention to meet the object and design of the device to be made.

Figure 1:
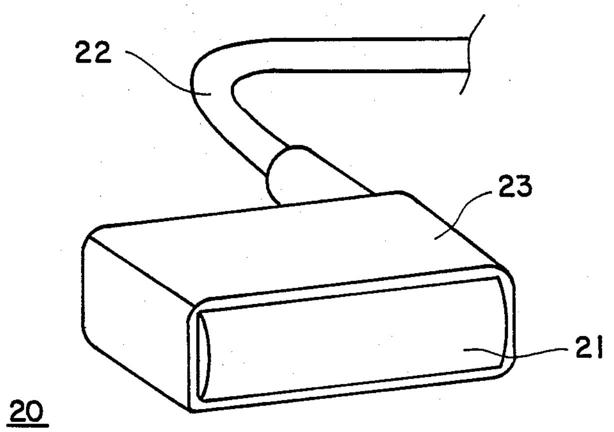
FIG. 1 PRIOR ART
FIG. 1 shows an appearance of exemplary ultrasonic transducer head.
Figure 2A:
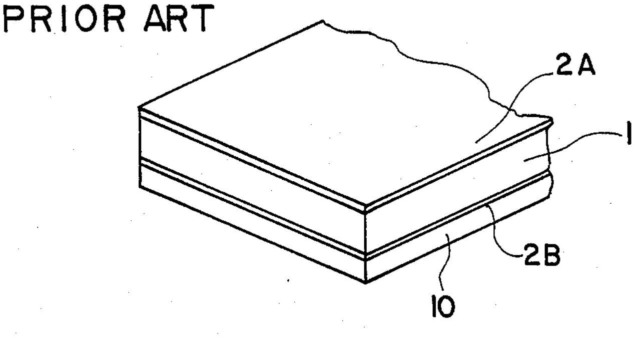
FIG. 2(a) PRIOR ART
Figure 2B:
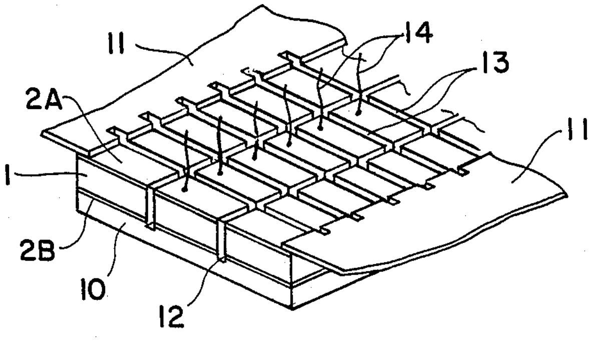
FIG. 2(b) PRIOR ART
Figure 2C:
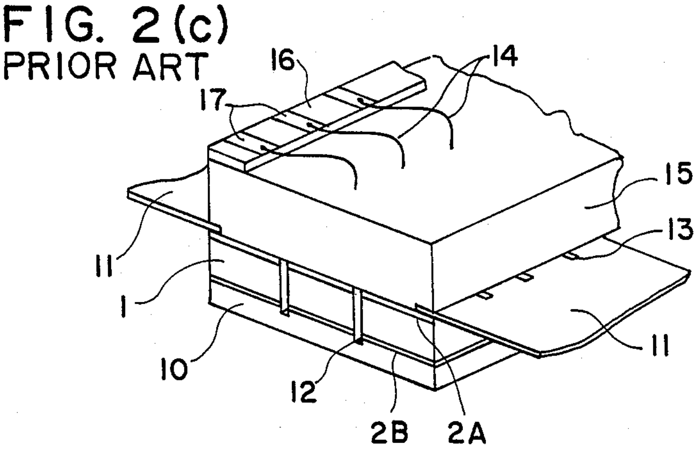
FIG. 2(c) PRIOR ART
Figure 3:
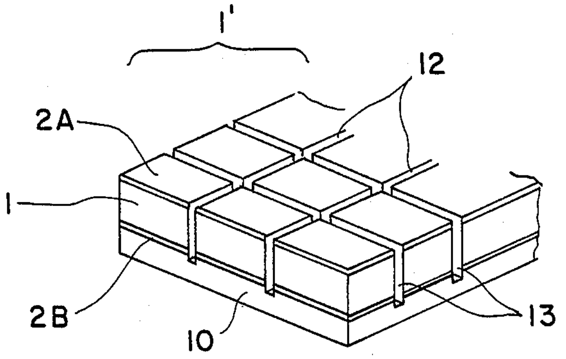
Figure 3:
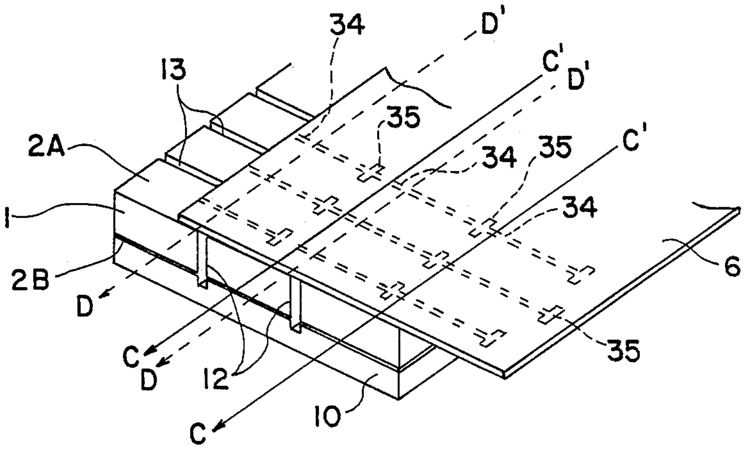
Figure 3:
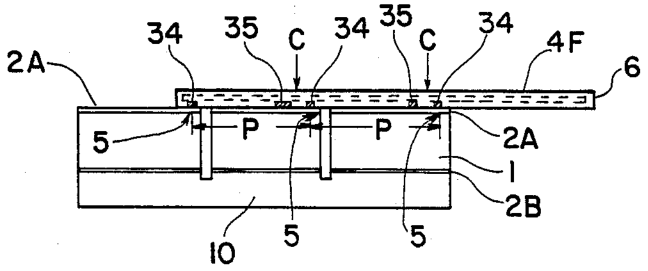
Figure 3:
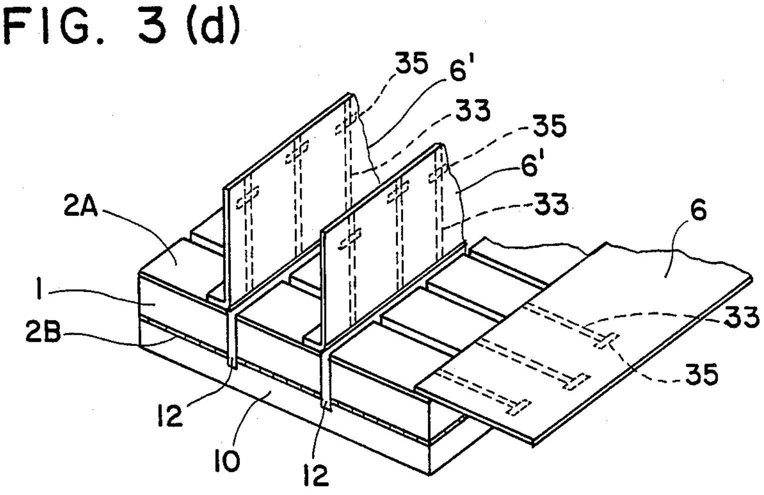
Figure 3:
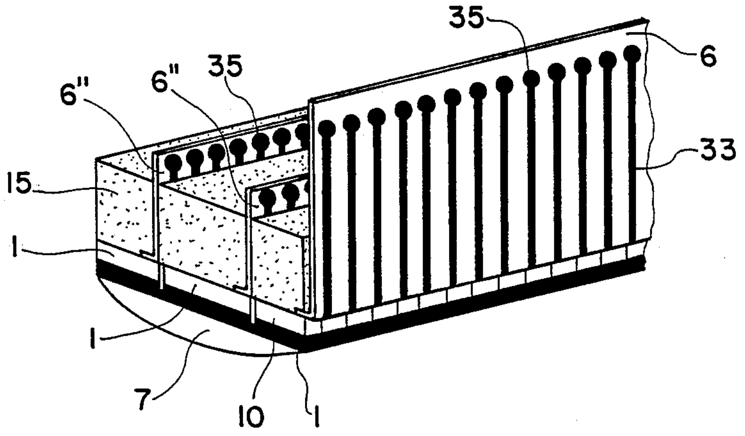

FIG. 3 shows the major steps relevant to the present invention for fabricating an ultrasonic transducer having 128×3 piezoelectric elements operated in a range of 3.5 MHz ultrasonic wave. In FIG. 3(*a*), a large size piezoelectric element 1' is made of lead zirconate titanate for example, which is called PZT in the art. The size of the PZT was about 100 mm long, 20 mm wide and 0.4 mm thick. The front and back sides of the PZT is metallized with silver to form the front and back electrodes 2B and 2A respectively. To the front electrode 2B is formed the front matching layer 10 of 0.2 mm thick by molding. The front matching layer 10 is made from a conductive paste called by a trade name C-840 manufactured by Amicon for example. These processes are all conventional ones in the art, so further details are omitted for the sake of simplicity.

Then the PZT is sliced from its back side by a slicer to cut out a matrix, leaving the front matching layer 10 as shown in FIG. 3(*a*). In this embodiment, the large size PZT 1' is divided into three parts by first cutting slits 12 which are parallel to the long edge of the PZT 1' (this direction becomes the azimuthal direction), and further divided into 128 by second cutting slits 13 which are orthogonal to the first slits 12. The depths of these slits are adjusted to be deep enough to divide the piezoelectric elements 1 from each other, but not so deep to cut them apart front matching layer 10, except the peripheral slits that cut the matrix off from the large size PZT 1'. The width of these slits are 0.05 mm, and the pitch of the first and second slits are respectively 5 mm and 0.6 mm. As a result, a matrix of 128×3 piezoelectric elements is cut out from the large size PZT 1'. Each of the matrix elements are composed by a piezoelectric element 1 which is 4.5 mm long, 0.55 mm wide and 0.4 mm thick. So, the total size of the piezoelectric matrix becomes approximately 76.8 mm. long and 15 mm wide.

Since the material forming of the front matching layer 10 is conductive, the front electrodes 2B of piezoelectric elements 1 are electrically connected to each other. If the conductivity of the front matching layer 10 is not enough, a thin foil of metal such as silver is attached between the piezoelectric element 1 and the front matching layer 10. These processes and technology are also conventional ones in the art.

Figure 4:
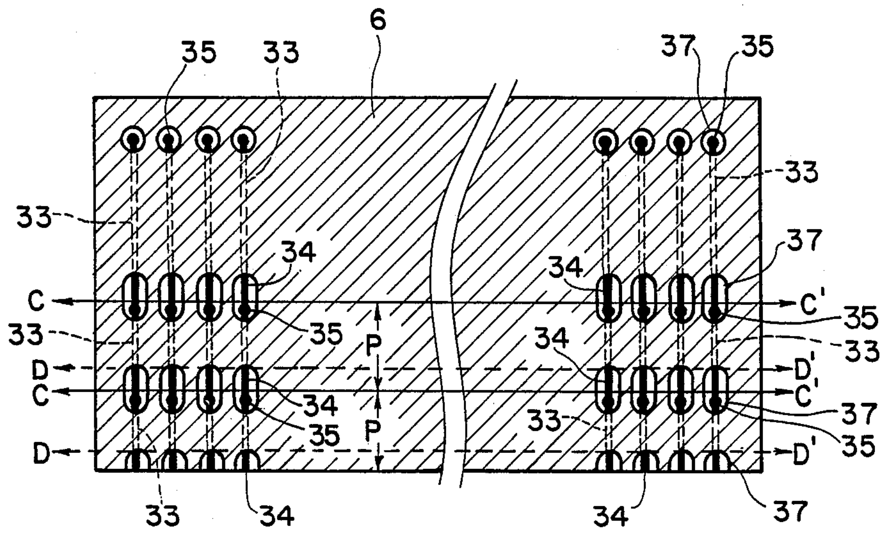
Figure 4:
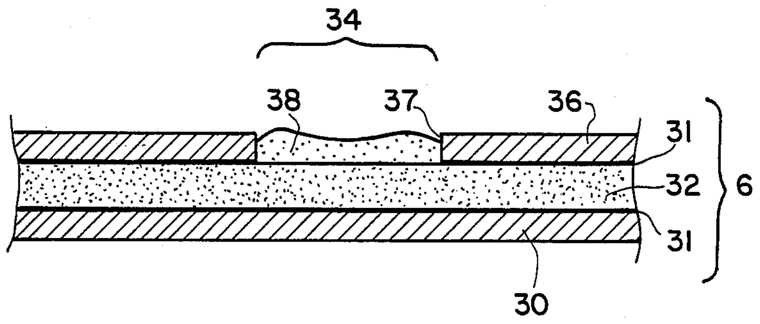
Figure 5A:
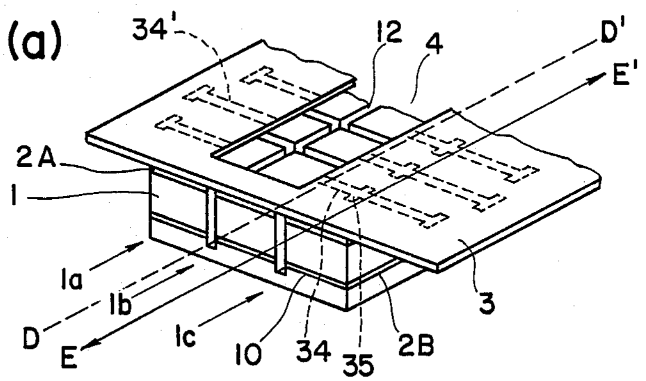
Figure 5B:
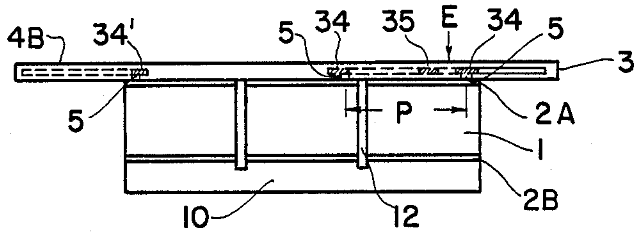
Figure 5C:
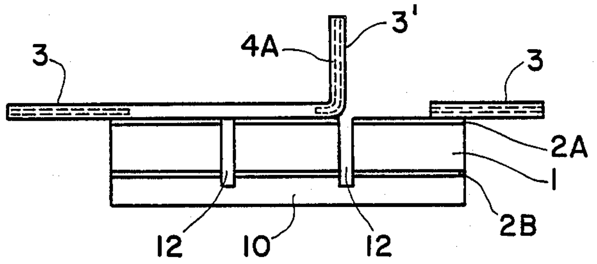
Figure 5D:
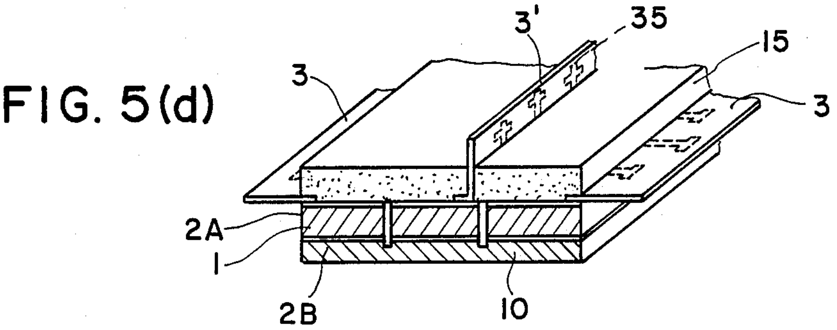

One feature of the present invention is to bond a wiring board directly to each back electrode 2A of these piezoelectric elements. The wiring board is flexible and made of polyimido sheet for example. The wiring pattern and structure of the wiring board are shown in FIG. 4, wherein FIG. 4(*a*) is a plan view of a wiring pattern, and FIG. 4(*b*) illustrates schematically a cross section of the wiring board at a portion including the bonding area. Over a base film 30 made of polyimido sheet of 25 μm thickness is glued a metal foil (copper foil for example) 32 of 35 μm thickness by a binder 31, and the metal foil 32 is patterned as shown in FIG. 4 (*a*) by photolithography. The entire surface of the wiring board 6 is covered with a cover coat film 36 to protect the surface of the board and keep insulation on the wiring pattern. At the portion of the bonding areas 34 and the terminal pads 35 are provided windows 37 to expose the copper wiring lines 33. These exposed portion of the copper wirings pattern are plated with solder 38.

The wiring lines 33 are pitched equal to that of the piezoelectric elements 1 in the azimuthal direction. This pitch will be called azimuthal pitch hereinafter. In this embodiment, therefore, 128 parallel bonding lines of 0.3 mm wide are aligned with a pitch of 0.6 mm. Practically, the width of these wiring lines 33 may exceed the width of the back electrode 2A when the azimuthal pitch becomes very small, as long as the insulation between each line is maintained.

At each portion on the wiring lines 33 to be bonded to the back electrode 2A is formed bonding areas 34. At predetermined portions on each of the wiring lines 33 are formed terminal pads 35. The pitch p of the bonding areas 34 on the bonding line 33 is equal to that of the matrix of piezoelectric element (abbreviated as piezoelectric matrix hereinafter) in the direction of elevation, that is called elevation pitch hereinafter. As can be seen in FIG. 4(*a*), on each wiring line 33 are aligned pairs of bonding area 34 and contact pad 35 connected to each other by the wiring line 33. The number of the pair is equal to the number of columns in the piezoelectric matrix. Each of the pair is aligned in series on the wiring line 33 in a manner, that the bonding area 34 of a pair is positioned close to the contact pad 35 of a neighboring pair. The meaning and merit of this relation between the positions of the bonding areas 34 and the terminal pads 35 will become clear in the description regarding the next fabrication step.

The printed wiring board 6 described above is aligned on the piezoelectric matrix as shown in FIGS. 3(*b*) and 3(*c*). FIG. 3(*b*) is a partial perspective view and FIG. 3(*c*) is a side view of this step. The wiring pattern shown in FIG. 4(a) is schematically indicated by broken lines. As can be seen in these figures, each of the bonding areas 34 are aligned to one edge portion of respective back electrode 2A. It will be understood that if one column of the bonding areas 34 are aligned to one edge portion of the back electrodes 2A of the matrix, all remaining bonding areas are also aligned to one edge portin of corresponding back electrodes, since the azimuthal pitch and the elevation pitch of the bonding areas 34 are respectively equal to those of the piezoelectric matrix. So, each of the bonding area 34 are soldered to respective bonding points 5 which are positioned at an edge portion of the back electrode 2A, as can be seen in FIGS. 3(*b*) and 3(*c*). This is the second feature of this invention. The bonding is done by means of seam welder for example. Using such equipment, the bonding to a plurality of bonding points can be done in one shot.

Then, the printed wiring board 6 is cut along the lines CC′ which are parallel to the first slits 12, and positioned between the bonding areas 34 and the nearest terminal pads 35 as shown in FIG. 3(*c*) and FIG. 4(*a*). The printed wiring boards 6 are then bent along the broken lines DD′ vertically to the surface of the piezoelectric elements as shown in FIG. 3(*d*). The lines DD′ are almost aligned at the edge of the first slits 12. It will be apparent in FIG. 3(*d*), that each of the separated pieces of printed wiring boards 6′ are L shaped, soldered at one edge portion of the piezoelectric elements 1 aligned in the azimuthal direction, and stretch vertically to the surfaces of the piezoelectric elements. These are important to reduce the reflection at the bonding point, because amplitude of the oscillation of the piezoelectric element is smaller than its center part of the back electrode. And since the printed wiring board extends vertically from the surface of the piezoelectric elements, the reflection from the wiring board is avoided, because the ultrasonic wave radiated backward from the piezoelectric element travels parallel to the printed wiring board 6′, and is absorbed by the backing plate 15. This is the third feature of this invention.

Next, the backing plate 15 is formed on the backside of the piezoelectric elements by molding. A mixture of epoxy resin and metal powder, tungsten for example, is used for the backing plate 15. The mixing rate varies depending on the wave length of the supersonic wave and the required damping factor. The other ends of these separated wiring boards are protruded from the molded surface of the backing plate 15 as shown in FIG. 3(*e*). In the figure, the printed wiring board 6 is bent vertically along a side of the backing plate 15. Finally an acoustic lens 7 is attached to the front matching layer 10. The acoustic lens is made of silicon rubber for example. The terminal pads 35 are connected to the multi-cored cable (not shown) and connected to the controller.

If the thickness of the backing plate 15 exceeds the height of the L shaped wiring board 6′, the length of the wiring board may be elongated by bonding a supplementary board to the terminal pads 35. For example in this embodiment, epoxy resin and tungsten powder having diameter of 3–50 μm have been used with a mixing ratio of 300–600% in weight. The thickness of the backing plate was necessary to be 5 to 10 mm. On the contrary, the heights of the L shaped printed wiring boards were approximately 4 mm. So, the separated printed wire boards 6′ are elongated by bonding an additional wiring board 6″ having almost the same pattern to that of FIG. 4(*a*). The bonding of these additional wiring boards is easily done using the terminal pads 35.

It will be understood from above disclosure, that the bonding of the printed wiring board to all of the piezoelectric elemtns is easy, so this bonding method is applicable to a piezoelectric matrix having more fine pitch. Further, the embodiment has been provided with only three columns of the matrix elements, but it can be easily applied to the matrix having more columns.

Figure 6:
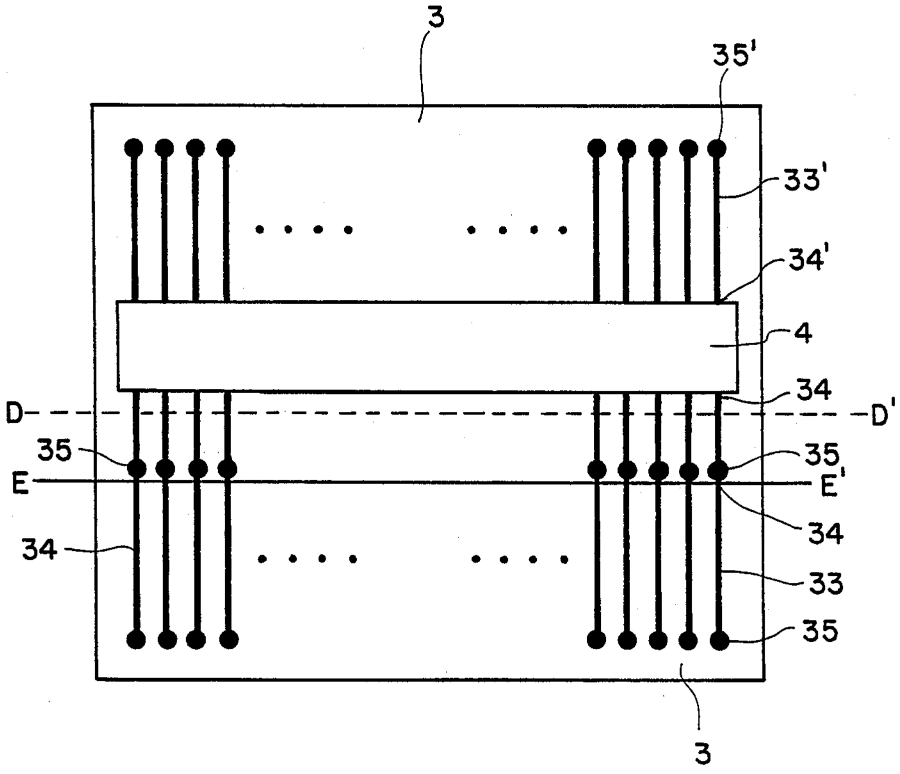
FIG. 6 shows a wiring pattern for the printed wiring board used for the bonding method shown in FIG. 5.
Figure 7A:
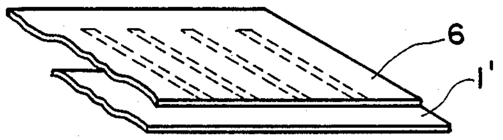
Figure 7B:
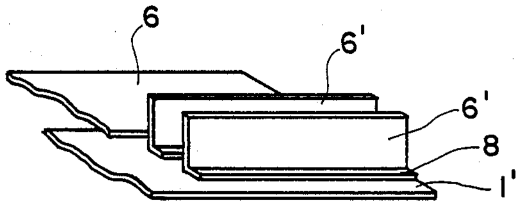
Figure 7C:
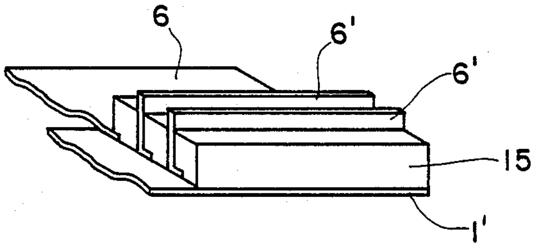
Figure 7D:
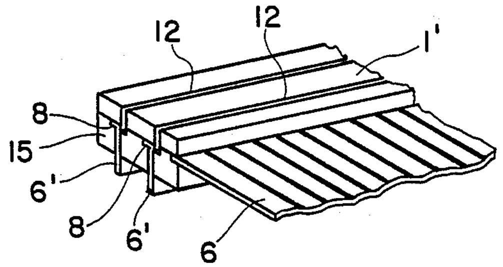
Figure 7E:
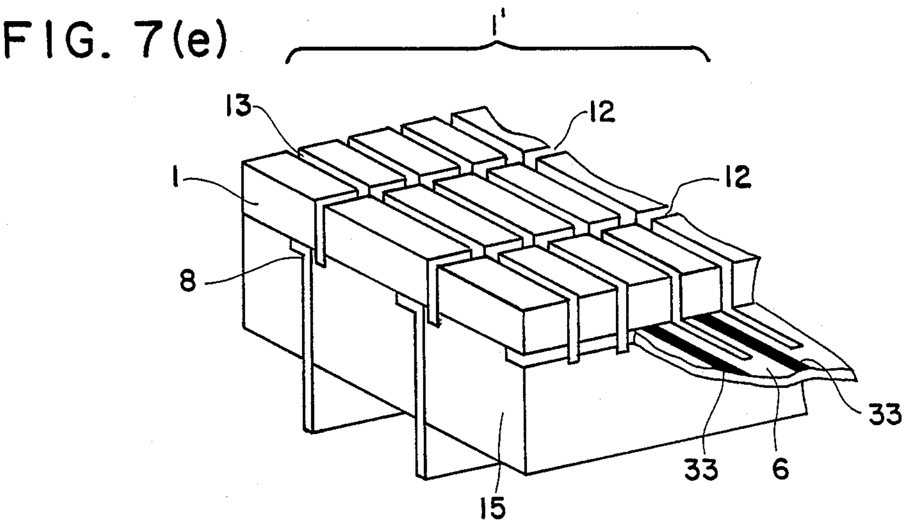
Figure 7F:
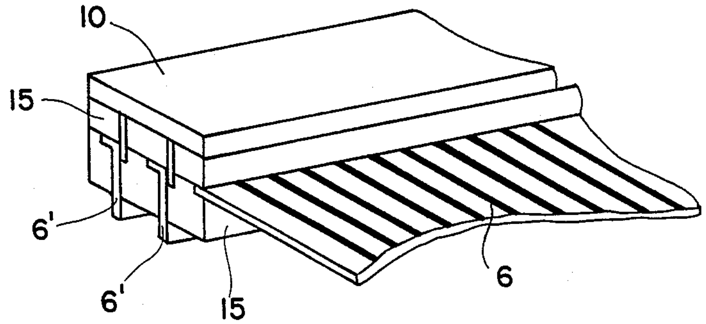

Next, a second embodiment of the wiring method will be disclosed with respect to FIG. 5. This embodiment is especially conventient when the number of columns in the matrix is small. In FIG. 5 is shown the piezoelectric elements arranged in a matrix having three columns. The process to form the matrix is the same to those described with respect to the first embodiment. The wiring pattern of the printed wiring board 3 used for this embodiment is shown in FIG. 6. In the figure, the wiring pattern is shown eliminating the cover coat 36 covering the surface of the wiring board. But the structure of the printed wiring board for this embodiment is essentially similar to that of FIG. 4(*b*).

But the printed wiring board 3 is provided with a rectangular opening 4. The length of the opening 4 is equal to the length of the piezoelectric matrix, and the width of the opening is less than two elevation pitches by twice of the length of the bonding area. On each long side of the rectangular opening 4 is provided respectively a wiring pattern which are similar to that of the first embodiment. The wiring lines 33, 33′ of respective wiring patterns are all terminated at the rectangular opening 4. The wiring lines 33 and 33′ are all similar to those of FIG. 4, except that on the wiring lines 33 are aligned two pairs of the bonding area 34 and the terminal pad 35, while on the wiring lines 33′ are aligned only one pair of them. The relative position of these bonding areas are all similar to those of FIG. 4(*a*), except that the bonding areas 34′ are positioned along the rectangular opening 4.

FIG. 5(*a*) is a partial perspective view, and FIG. 5(*b*) is a side view illustrating a state when the printed wiring board 3 is aligned to the piezoelectric element matrix. The pattern and the rectangular opening 4 of the printed circuit board 3 is designed so that the major parts of the first column 1a and the second column 1b are exposed through the rectangular opening 4, but the third column 1*c* is covered entirely by the printed wiring board 3. The bonding areas 34 and 34′ are aligned respectively to one side portion of corresponding back electrodes 2A of the first column 1*a*, and the second column 1*b*. As will be apparent form FIG. 5(*b*), the bonding areas 34' are positioned on the opposite side of the back electrode 2A in the column 1*a*, corresponding to that of the bonding pads 34 aligned to the second column 1b. By doing so, both ends of the printed wiring board 3 are extended outward from the piezoelectric matrix. This minimizes the backward reflection. The aligning of the printed wiring board is easier compared to that of the first embodiment. These bonding areas are bonded to respective bonding point 5.

After cutting the printed wiring board at a line EE', the printed wiring board is bent along the broken line DD' vertically to the matrix as shown in FIG. 5(*c*). The line EE' is parallel to the first slits 12, and positioned between the bonding areas 34 and the nearest terminal pads 35 as shown in FIG. 5(*a*) and FIG. 6. The dotted line DD' is aligned to the first slits 12. Then the backing plate 15 is molded over the matrix surface as shown in FIG. 5(*d*). The cut edge of each separated pieces of the printed wiring board 3' protrudes from the surface of the molded backing plate 15. It will be apparent that the form of FIG. 5(*d*) is equivalent to that of FIG. 3(*e*). The succeeding processes are similar to those of the first embodiment.

The third embodiment of the present invention to fabricate the piezoelectric matrix elements will be described with respect to FIG. 7. In this embodiment, the large sized piezoelectric element 1' is cut from its front side after the printed wiring board 6 is bonded and the backing plate is molded. FIG. 7 illustrates the major fabrication steps.

First as shown in FIG. 7(*a*), a printed wiring board 6 is placed on the backside of a large size piezoelectric element 1'. The printed wiring board 6 is a similar one as shown in FIG. 4. Though it is not shown in the figure for the sake of simplicity, both sides of the large size piezoelectric element 1' are metallized to form the front and back electrodes. The bonding areas (not shown) are bonded to the back electrode, the printed wiring board 6 is cut along the azimuthal direction, and bent vertically to the surface of the piezoelectric element in a manner described with respect to the first embodiment. The appearance of this stage becomes as shown in FIG. 7(*b*). Then the backing plate 15 is molded as shown in FIG. 7(*c*), like a manner described with respect to the first embodiment.

When the device is turned over, the front side of the piezoelectric element 1' appears on the top of the device as shown in FIG. 7(*d*). The large sized piezoelectric element 1' can be cut from its front side using a slicer, for example. FIG. 7(*d*) shows a state wherein the large sized piezoelectric element 1' is cut in azimuthal direction by two first slits 12. The position of the first slits 12 is aligned to just outside of the L bend corner 8 of the separated print wiring boards 6' as shown in FIG. 7(*d*). Therefore, the first slits 12 does not harm the printed wiring boards 6 or 6' buried in the backing plate 15. The large size piezoelectric element 1' is then cut along second slits 13 which are perpendicular to the slits 12, and separated between each other with a pitch equal to the azimuthal pitch of the piezoelectric matrix.

FIG. 7(*e*) is an enlarged partially cutout view illustrating the relation between the cutting slits and the printed wiring board. The large size piezoelectric element 1' is cut along the second slits 13 which are orthogonal to the first slits 12. The depth of these slits 12 and 13 are deeper than the thickness of the piezoelectric element 1. So, as can be seen in the figure, both of the slits are cut into the backing plate 15. By doing so, the printed wiring board 6 is partially cut by the second slits 13. The second slits 13 are aligned between the wiring lines 33 in parallel to them. Accordingly, they will never damage the wiring pattern. Moreover, if the azimuthal pitch becomes very small, the second slits 13 may cut the sides of the wiring line 33. But even in such case, the function of the wiring lines 33 is not lost, and the insulation between the lines is also maintained. Further, it was also found that such over cutting of the slits into the backing plate 15 is preferable to reduce the interaction between the adjacent piezoelectric elements.

Then, the front matching layer 10 is attached as shown in FIG. 7(*f*). The state of the FIG. 7(*f*) is equivalent to that of FIG. 3(*e*), when the acoustic lens 7 is attached to it.

Comparing the third embodiment to the preceding embodiments, it will be understood that the handling of the elements in the process is easier. The cutting method of the large size piezoelectric element of the third embodiment has been described with regard to a device similar to the first embodiment. But it will be apparent that the cutting method described in the third embodiment may be applied also to the second embodiment.

The detailed description of the material, the size and dimension of the parts have been given only with respect to the first embodiment, and they were omitted in the description for the second and the third embodiment. They all belong to the choice of the design, and do not directly relate to the invention. Therefore, any modification using the state-of-the-art technology may be possible within the scope of the present invention.

What is claimed is as follows:

1. An ultrasonic transducer having a plurality of piezoelectric elements arranged in a piezoelectric matrix, said piezoelectric matrix including a plurality of piezoelectric arrays aligned in parallel to each other, each of said piezoelectric arrays including a portion of said plurality of piezoelectric elements aligned in an azimuthal direction, and each of said piezoelectric elements having a front electrode and a back electrode for applying electrical potential between them to energize the piezoelectric element and radiate ultrasonic wave or for receiving the electrical potential from a received wave, said ultrasonic transducer further comprising:

a front matching layer attached to each of said front electrodes of said piezoelectric elements for matching an acoustic impedance between said piezoelectric elements and species to which the ultrasonic wave is transmitted or from which the wave is received;

a backing plate having a back surface provided on the backside of said piezoelectric elements for absorbing an ultrasonic wave radiated backward from said piezoelectric elements to prevent reflection from backward portions of said piezoelectric elements; and L shaped printed wiring boards respectively aligned to said piezoelectric arrays, each of said L shaped printed wiring boards having:

a plurality of bonding areas positioned on one branch of said L shaped printed wiring board, each of said bonding areas being bonded to a respective said back electrode of a said piezoelectric element aligned in said piezoelectric array;

a plurality of terminal pads provided on another branch of said L shaped printed wiring board; and a plurality of wiring lines for electrically connecting said bonding areas to respective terminal pads, said another branch of the L shaped printed wiring board being extended vertically to said back electrode through said backing plate, and said terminal pads protruding from the back surface of said backing plate.

2. Ultrasonic transducer according to claim 1, wherein each of said bonding areas are bonded to an edge portion on said respective back electrode of said piezoelectric element arranged in said array.

3. Ultrasonic transducer according to claim 1, wherein said L shaped printed wiring board includes a flexible printed wiring board, one end of which is provided with said bonding areas and forms one branch of said L shaped printed wiring board, while another end of said printed wiring board is provided with said terminal pads and is bent vertically to the back electrode of said piezoelectric elements to form said another branch of said L shaped printed wiring board.

4. An ultrasonic transducer according to claim 3, wherein said another branch of L shaped printed wiring is extended in its length by bonding an additional printed wiring board in order to protrude one end of said additional printed wiring board from the back surface of said backing plate.

5. Ultrasonic transducer according to claim 1 wherein said another branch of L shaped printed wiring board is extended in its length by bonding an additional printed wiring board to protrude one end of said additional printed wiring board from the back surface of said backing plate.

6. A method for fabricating an ultrasonic transducer having a plurality of piezoelectric elements aligned in a piezoelectric matrix, said piezoelectric elements being separated from each other by first slits aligned in parallel to an azimuthal direction and separated from each other with an elevation pitch, and second slits aligned orthogonally to said first slits and separated from each other with an azimuthal pitch, and each of said piezoelectric elements having a front electrode and a back electrode, said method comprising the steps of:

(a) preparing a flexible printed wiring board having a wiring pattern comprising:
 a plurality of bonding areas arranged in a matrix having the azimuthal pitch and elevation pitch respectively equal to those of said piezoelectric matrix;
 a plurality of contact pads each of which corresponds to a respective bonding area; and
 a plurality of wiring lines for connecting each bonding area to a corresponding said contact pad;

(b) aligning said flexible printed wiring board on back electrodes of said piezoelectric elements, such that each of said bonding areas is aligned to one edge portion of the back electrode of corresponding piezoelectric element, and bonding each of said bonding areas to corresponding one edge portion of said back electrode;

(c) cutting said printed wiring board along lines which are parallel to said first slits and positioned between the bonding areas and the most neighboring contact pad to form separated pieces thereof;

(d) bending a separated end of each of said separated pieces of said flexible printed wiring board by preceding process (c) vertically to the surface of said back electrodes; and (e) forming a backing plate having a back surface by molding on the back side of said piezoelectric elements, whereby each of the ends of said separated pieces of flexible printed wiring board protrudes from the back surface of said backing plate.

7. A method for fabricating an ultrasonic transducer according to claim 6, wherein said flexible printed wiring board further comprises a rectangular opening, the length of which is equal to the length of said matrix of piezoelectric elements, and width of which is less than two elevation pitches by twice of the length of said bonding area, and on each longer side of said rectangular opening is respectively provided a wiring pattern as recited in claim 5.

8. A method for fabricating ultrasonic transducer according to claim 7, further comprising a step of bonding an additional wiring board to each of said bent pieces of printed wiring board to extend the length of them such that the ends of respective additional boards protrude from the back surface of said backing plate.

9. A method for fabricating an ultrasonic transducer according to claim 6, further comprising a step of bonding an additional wiring board to each of said bent pieces of printed wiring board to extend the length of them such that the ends of respective additional boards protrude from the back surface of said backing plate.

10. A method for fabricating an ultrasonic transducer having a piezoelectric matrix which includes a plurality of piezoelectric elements arranged in azimuthal and elevation directions respectively with azimuthal and elevation pitch, said method comprising the steps of:

(A) preparing a large size piezoelectric element of area sufficient to cover said piezoelectric matrix, and having a thickness equal to that of said piezoelectric elements, both the front and back sides of said large size piezoelectric element being respectively provided with a front electrode and a back electrode;

(B) aligning a flexible printed wiring board on said back electrode of said large size piezoelectric element, said flexible printed wiring board having a wiring pattern comprising;
 a plurality of bonding areas arranged in a matrix having an azimuthal pitch and elevation pitch respectively equal to those of said piezoelectric matrix;
 a plurality of contact pads each of which corresponding to a respective bonding area; and
 a plurality of wiring lines for connecting each bonding area to the corresponding contact pad;

(C) cutting said printed wiring board in the azimuthal direction along lines which are positioned between the bonding areas and the nearest terminal pad to form separated pieces thereof;

(D) bending the separated end of each of said separated pieces of said flexible printed wiring board by preceding process C) vertically to the surface of said back electrodes; and (E) forming a back plate having a back surface by molding on the back side of said piezoelectric elements, whereby each end of said separated pieces of printed wiring board is protruded from the back surface of said backing plate;

(F) cutting said large size piezoelectric element from its front electrode side in both the azimuthal and elevation directions respectively with said azimuthal pitch and elevation pitch to form said matrix of piezoelectric elements; and (G) forming a front matching layer attached to each of said front electrodes of said piezoelectric elements for matching an acoustic impedance between said piezoelectric elements and species to or from which the ultrasonic wave is transmitted or from which the wave is received.

11. A method for fabricating an ultrasonic transducer according to claim 10, wherein said flexible printed wiring board further comprising a rectangular opening, the length of which is equal to the length of said piezoelectric matrix in the azimuthal direction, and the width of which is less than two elevation pitches by twice of the length of said bonding area, and on each longer side of said rectangular opening is respectively provided a wiring pattern as recited in claim 10.

12. A method for fabricating an ultrasonic transducer according to claim 11, further comprising a step of bonding an additional wiring board to each of said bent pieces of printed wiring board to extend the length of them such that the ends of respective additional boards protrude from the back surface of said backing plate.

13. A method for fabricating an ultrasonic transducer according to claim 10, further comprising a step of bonding an additional wiring board to each of said bent pieces of printed wiring board to extend the length of them such that the ends of respective additional boards protrude from the back surface of said backing plate.

* * * * *